(12) United States Patent
Yang et al.

(10) Patent No.: US 10,249,495 B2
(45) Date of Patent: Apr. 2, 2019

(54) DIAMOND LIKE CARBON LAYER FORMED BY AN ELECTRON BEAM PLASMA PROCESS

(71) Applicant: Applied Materials, Inc., Santa Clara, CA (US)

(72) Inventors: Yang Yang, San Diego, CA (US); Lucy Chen, Santa Clara, CA (US); Jie Zhou, San Jose, CA (US); Kartik Ramaswamy, San Jose, CA (US); Kenneth S. Collins, San Jose, CA (US); Srinivas D. Nemani, Sunnyvale, CA (US); Chentsau Ying, Cupertino, CA (US); Jingjing Liu, Milpitas, CA (US); Steven Lane, Porterville, CA (US); Gonzalo Monroy, Santa Clara, CA (US); James D. Carducci, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 172 days.

(21) Appl. No.: 15/195,640

(22) Filed: Jun. 28, 2016

(65) Prior Publication Data
US 2017/0372899 A1 Dec. 28, 2017

(51) Int. Cl.
*C23C 16/26* (2006.01)
*H01L 21/033* (2006.01)
(Continued)

(52) U.S. Cl.
CPC .......... *H01L 21/0332* (2013.01); *C01B 32/25* (2017.08); *C23C 16/26* (2013.01);
(Continued)

(58) Field of Classification Search
USPC ...... 427/249.1, 331, 348, 419.2, 419.7, 531, 427/533, 553, 577
See application file for complete search history.

(56) References Cited

U.S. PATENT DOCUMENTS 4,783,368 A * 11/1988 Yamamoto .......... H01L 21/4803
257/E23.006
5,352,493 A 10/1994 Dorfman et al.
(Continued)

FOREIGN PATENT DOCUMENTS

JP 61-042122 * 2/1986
JP 09-315889 * 12/1997
(Continued)

OTHER PUBLICATIONS

Ravi et al "Deposition of diamond-like carbon films on aluminum substrates by RF-PECVD technique:Influence of process parameters." Diamond & Related Materials 16 (2007) p. 90-97. (Year: 2007).*

(Continued)

*Primary Examiner* — Archene A Turner
(74) *Attorney, Agent, or Firm* — Patterson + Sheridan, LLP

(57) ABSTRACT

Methods for forming a diamond like carbon layer with desired film density, mechanical strength and optical film properties are provided. In one embodiment, a method of forming a diamond like carbon layer includes generating an electron beam plasma above a surface of a substrate disposed in a processing chamber, and forming a diamond like carbon layer on the surface of the substrate. The diamond like carbon layer is formed by an electron beam plasma process, wherein the diamond like carbon layer serves as a hardmask layer in an etching process in semiconductor applications. The diamond like carbon layer may be formed by bombarding a carbon containing electrode disposed in a
(Continued)

processing chamber to generate a secondary electron beam in a gas mixture containing carbon to a surface of a substrate disposed in the processing chamber, and forming a diamond like carbon layer on the surface of the substrate from elements of the gas mixture.

16 Claims, 4 Drawing Sheets

(51) Int. Cl.
  C23C 16/505 (2006.01)
  C23C 16/509 (2006.01)
  C23C 16/56 (2006.01)
  H01J 37/32 (2006.01)
  H01L 21/02 (2006.01)
  H01L 21/308 (2006.01)
  H01L 21/3213 (2006.01)
  C01B 32/25 (2017.01)
  H01L 21/762 (2006.01)
(52) U.S. Cl.
  CPC .......... *C23C 16/505* (2013.01); *C23C 16/509* (2013.01); *C23C 16/56* (2013.01); *H01J 37/3233* (2013.01); *H01J 37/3255* (2013.01); *H01J 37/3266* (2013.01); *H01J 37/32357* (2013.01); *H01J 37/32422* (2013.01); *H01L 21/0234* (2013.01); *H01L 21/02115* (2013.01); *H01L 21/02274* (2013.01); *H01L 21/0337* (2013.01); *H01L 21/3081* (2013.01); *H01L 21/3086* (2013.01); *H01L 21/32139* (2013.01); *H01J 37/32623* (2013.01); *H01J 2237/327* (2013.01); *H01J 2237/3321* (2013.01); *H01L 21/76224* (2013.01)

(56) References Cited

U.S. PATENT DOCUMENTS

| | | | |
|---|---|---|---|
| 5,378,316 A | 1/1995 | Franke et al. | |
| 5,942,854 A | 8/1999 | Ryoji et al. | |
| 6,013,980 A | 1/2000 | Goel et al. | |
| 6,320,295 B1 | 11/2001 | McGill et al. | |
| 6,900,002 B1 | 5/2005 | Plat et al. | |
| 7,942,111 B2* | 5/2011 | Burger | C23C 8/36 204/192.1 |
| 8,119,240 B2* | 2/2012 | Cooper | C23C 14/0605 204/192.16 |
| 2006/0246290 A1* | 11/2006 | Oda | C23C 14/024 204/192.1 |
| 2007/0275569 A1 | 11/2007 | Moghadam et al. | |
| 2009/0186206 A1* | 7/2009 | Ito | C23C 14/0605 427/249.7 |
| 2013/0146443 A1* | 6/2013 | Papa | C23C 14/35 204/192.16 |
| 2016/0053366 A1* | 2/2016 | Stowell | C23C 14/35 204/192.15 |
| 2016/0276134 A1 | 9/2016 | Collins et al. | |

FOREIGN PATENT DOCUMENTS

| | | | |
|---|---|---|---|
| JP | 2010-024476 | * | 2/2010 |
| JP | 2010024476 A | | 2/2010 |

OTHER PUBLICATIONS

Yasuoka et al "Diamond-like carbon films from CO source gas by RF olasma CVD." Jap Journal of Applied Physica 54 (2015). (Year: 2015).*
Wu et al. "Effect of vacuum annealing on the microstructure and tribological behaviour og hydrogenated amorphous carbon films prepared by magnetron sputtering." Porceedings of the Mech. Eng. Part J:Journal of Eng. Tribologigy & 227 (2013) p. 729-737. (Year: 2013).*
Druz et al. "Diamond-like carbon films deposited using broad, uniform ion beam from a RF inductively coupled CH4-plasma source". Diamond and Related Materials 7 (1998) p. 965-972. (Year: 1998).*
International Search Report and Written Opinion from PCT/US2017/035434 dated Sep. 13, 2017.
Masahito Ban et al. "Stress and Structural Properties of Diamon-like Carbon Films Deposited by Electron Beam Excited Plasma CVD" Diamon and Related Materials, vol. 12, Issue 1, Jan. 2003, pp. 47-56.

* cited by examiner

DIAMOND LIKE CARBON LAYER FORMED BY AN ELECTRON BEAM PLASMA PROCESS

BACKGROUND

Field of the Disclosure

The present disclosure relates to the fabrication of integrated circuits and to a process for forming a diamond like carbon layer with high etching selectivity, high film density and good mechanical strength on a substrate. More specifically, the disclosure relates to a process for manufacturing a diamond like carbon layer using electron beam plasma process to form the diamond like carbon layer with high etching selectivity, good mechanical strength, low stress and desired film transparency on a substrate for semiconductor applications.

Description of the Background Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced to the sub-micron scale, it is now necessary to use low resistivity conductive materials (e.g., copper) as well as low dielectric constant insulating materials (dielectric constant less than about 4) to obtain suitable electrical performance from such components.

The demands for greater integrated circuit densities also impose demands on the process sequences used in the manufacture of integrated circuit components. For example, in process sequences that use conventional photo lithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer. Thus, a highly selective etchant enhances accurate pattern transfer.

As the geometry limits of the structures used to form semiconductor devices are pushed against technology limits, the need for accurate pattern transfer for the manufacture of structures having small critical dimensions and high aspect ratios has become increasingly difficult. For example, the thickness of the energy sensitive resist has been reduced in order to control pattern resolution. Such thin resist layers (e.g., less than about 2000 Å) can be insufficient to mask underlying material layers during the pattern transfer step due to attack by the chemical etchant. An intermediate layer (e.g., silicon oxynitride, silicon carbine or carbon film), called a hardmask layer, is often used between the energy sensitive resist layer and the underlying material layers to facilitate pattern transfer because of its greater resistance to chemical etchants. When etching materials to form structures having aspect ratios greater than about 5:1 and/or critical dimensional less than about 50 nm, the hardmask layer utilized to transfer patterns to the materials is exposed to aggressive etchants for a significant period of time. After a long period of exposure to the aggressive etchants, the hardmask layer without sufficient etching resistance may be changed in film properties, resulting in inaccurate pattern transfer and loss of dimensional control.

Furthermore, the similarity of the materials selected for the hardmask layer and the adjacent layers disposed in the film stack may also result in similar etch properties therebetween, thereby resulting in poor selectivity during etching. Poor selectivity between the hardmask layer and adjacent layers may result in non-uniform, tapered and deformed profile of the hardmask layer, thereby leading to poor pattern transfer and failure of accurate structure dimension control.

Additionally, relatively loose film structures (e.g., amorphous film structures) in the deposited film and/or hardmask layer may also result in low film mechanical strength and low hardness that result in the hardmask layer being unable to survive an entire etching process due to the attack of the aggressive etchants during the etching process. Insufficient film hardmask or film mechanical strength may adversely affect pattern transfer accuracy in the subsequent processes.

Therefore, there is a need in the art for an improved hardmask layer with desired film properties for subsequent lithography and etching processes.

SUMMARY

Methods for forming a diamond like carbon layer with desired film density, mechanical strength as well as optical film properties are provided. In one embodiment, a method of forming a diamond like carbon layer includes generating an electron beam plasma above a surface of a substrate disposed in a processing chamber, and forming a diamond like carbon layer on the surface of the substrate disposed in the processing chamber.

In another embodiment, a hardmask layer comprising a diamond like layer is formed by an electron beam plasma process. The diamond like carbon layer serves as a hardmask layer in an etching process in semiconductor applications.

In yet another embodiment, a method of a diamond like carbon layer includes bombarding a carbon containing electrode disposed in a processing chamber to generate a secondary electron beam in a gas mixture containing carbon to a surface of a substrate disposed in the processing chamber, and forming a diamond like carbon layer on the surface of the substrate in the processing chamber.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Embodiments of the present disclosure provide methods for forming a diamond like carbon layer with desired film properties, such as film transparency, mechanical strength, film hardness and low stress. In one embodiment, the diamond like carbon layer is suitable for use as a hardmask layer. The diamond like carbon layer with desired film properties may be obtained by an electron beam plasma deposition process. The electron beam plasma provides secondary electron beam required for depositing the carbon layer to form the carbon-like film structure with relatively strong bonding structure and mechanical strength. The diamond like carbon layer formed by the electron beam plasma maintains low stress level while having film density within a desired range. The diamond like carbon layer has optical film properties, such as a desired range of refraction index (n) and absorption coefficient (k), that are advantageous for photolithographic patterning processes.

Figure 1:
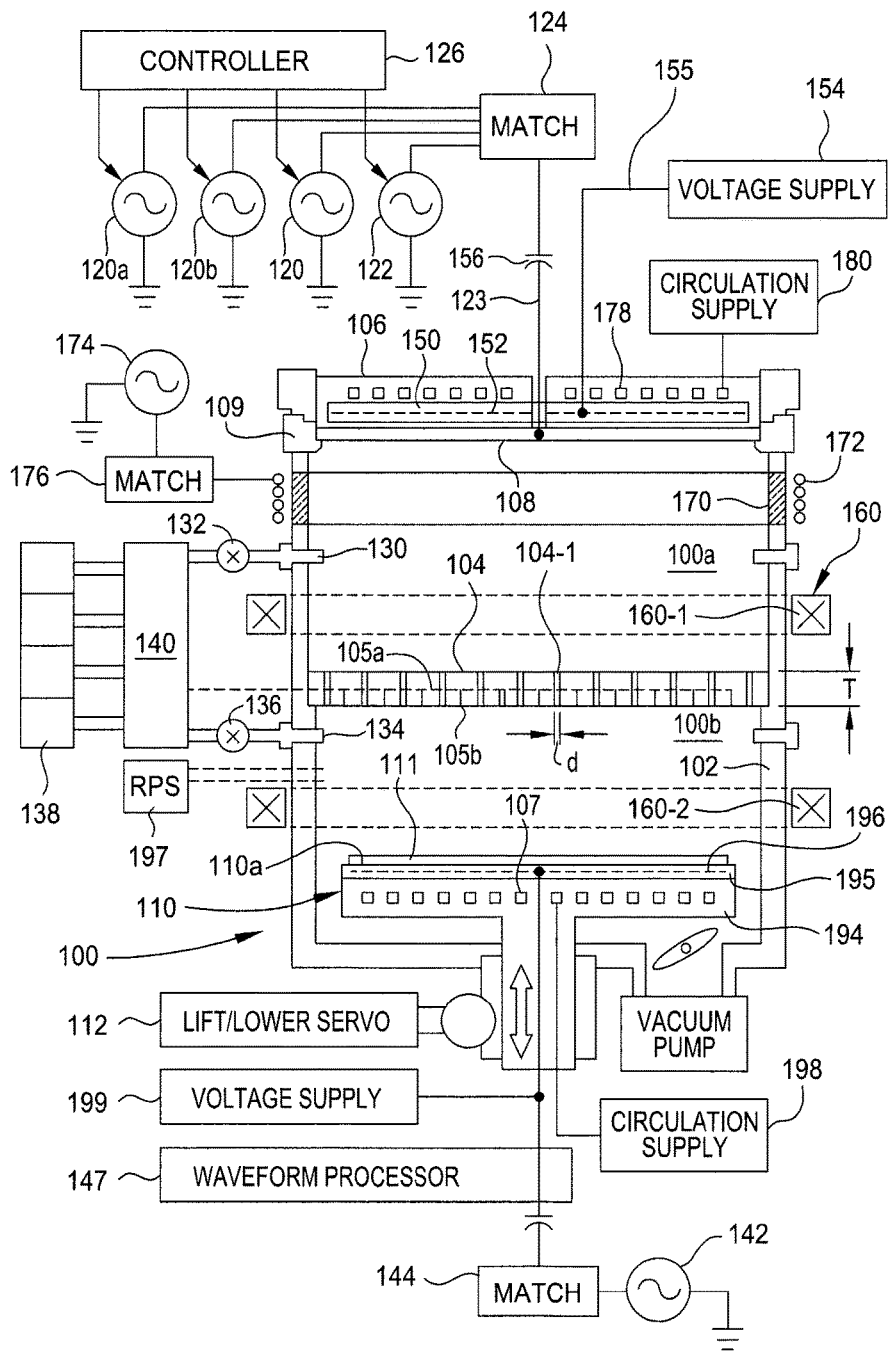
FIG. 1 depicts a schematic illustration of one example of a deposition apparatus in which electron beam plasma technique can be used to practice embodiments of the disclosure.

FIG. 1 depicts an electron beam plasma chamber having a vacuum chamber body defining a chamber 100 including a side wall 102 of cylindrical shape. The chamber 100 is divided by a grid filter 104 into an upper chamber 100a and a lower chamber 100b. The lower chamber 100b is a drift space because of a lack of substantial electric field therein in the absence of an applied bias voltage. A ceiling 106 overlies the upper chamber 100a, and supports an electrode 108. In one embodiment, the electrode 108 is formed of a process compatible material such as silicon, carbon, silicon carbon compound or a silicon-oxide compound. In an alternative embodiment, the electrode 108 is formed of a metal oxide such as aluminum oxide, yttrium oxide, or zirconium oxide. The ceiling 106 and the electrode 108 may be disk-shaped. A bottom surface of the electrode 108 faces the grid filter 104 and is exposed to the interior of the upper chamber 100a. In one embodiment, an insulator or dielectric ring 109 surrounds the electrode 108.

In one particular embodiment depicted herein, the electrode 108 is formed by a carbon containing material that may assist providing carbon sources during a diamond like carbon layer deposition process. Thus, the electrode 108 may be consumed after a number of the diamond like carbon layer deposition processes are performed. The material dislodged from the electrode 108 may assist forming a diamond like carbon layer with high film density by consumption of the materials bombarded from the electrode 108. Thus, periodical replacement of the electrode 108 may be performed to ensure process reliability and repeatability.

A workpiece support pedestal 110 for supporting a substrate 111, e.g., a workpiece, in the lower chamber 100b has a workpiece support surface 110a facing the grid filter 104 and may be movable in the axial direction by a lift servo 112. In one embodiment, the workpiece support pedestal 110 includes an insulating puck 195 forming the workpiece support surface 110a, a workpiece electrode 196 inside the insulating puck 195, and a chucking voltage supply 199 connected to the workpiece electrode 196. Additionally, a base layer 194 underlying the insulating puck 195 has internal passages 107 for circulating a thermal medium (e.g., a liquid) from a circulation supply 198. The circulation supply 198 may function as a heat sink or as a heat source.

An RF source power generator 120 having a VHF frequency (e.g., 160 MHz) and a lower frequency RF source power generator 122 having a frequency below the VHF range or below the HF range (e.g., in the MF or LF range, e.g., 2 MHz) are coupled to the electrode 108 through an impedance match 124 via an RF feed conductor 123. In one embodiment, the impedance match 124 is adapted to provide an impedance match at the different frequencies of the RF source power generators 120 and 122, as well as filtering to isolate the power generators from one another. The output power levels of the RF source power generators 120, 122 are independently controlled by a controller 126. As will be described in detail below, power from the RF source power generators 120, 122 is coupled to the electrode 108. In one embodiment, the ceiling 106 is electrically conductive and is in electrical contact with the electrode 108, and the power from the impedance match 124 is conducted through the ceiling 106 to the electrode 108.

In one embodiment, the side wall 102 is formed of metal and is grounded. In one embodiment, the surface area of grounded internal surfaces inside the upper chamber 100a is at least twice the surface area of the electrode 108. In one embodiment, the grounded internal surfaces inside the chamber 100 may be coated with a process compatible material such as silicon, carbon, silicon carbon compound or a silicon-oxide compound. In an alternative embodiment, grounded internal surfaces inside the chamber 100 may be coated with a material such as aluminum oxide, yttrium oxide, or zirconium oxide In one embodiment, the RF source power generator 120 may be replaced by two VHF power generators 120a and 120b that are separately controlled. The VHF power generator 120a has an output frequency in a lower portion (e.g., 30 MHz to 150 MHz) of the VHF band, while the VHF power generator 120b has an output frequency in an upper portion (e.g., 150 MHz to 300 MHz) of the VHF band. The controller 126 may govern plasma ion density by selecting the ratio between the output power levels of the VHF power generators 120a and 120b. With the two VHF power generators 120a and 120b, radial plasma uniformity in the upper chamber 100a can be controlled by selecting the gap of upper chamber 100a (the distance between the electrode 108 and the grid filter 104) such that by itself the lower VHF frequency produces an edge-high radial distribution of plasma ion density in the upper chamber 100a and by itself the upper VHF frequency produces a center-high radial distribution of plasma ion density. With such a selection, the power levels of the two VHF power generators 120a, 120b are then set to a ratio at which uniformity of radial distribution of plasma ion density is optimized.

In one embodiment, the ceiling 106 is a support for the electrode 108 and includes an insulating layer 150 containing a chucking electrode 152 facing the electrode 108. A DC chucking voltage supply 154 is coupled to the chucking electrode 152 via the feed conductor 155, for electrostatically clamping the electrode 108 to the ceiling 106. A DC blocking capacitor 156 may be connected in series with the output of the impedance match 124. The controller 126 may control the DC chucking voltage supply 154. In one embodiment, the RF feed conductor 123 from the impedance match 124 may be connected to the electrode support or ceiling 106 rather than being directly connected to the electrode 108. In such an embodiment, RF power from the RF feed conductor 123 may be capacitively coupled from the electrode support to the electrode 108. In one embodiment, upper gas injectors 130 provide process gas into the upper chamber 100a through a first valve 132. In one embodiment, lower gas injectors 134 provide process gas into the lower chamber 100b through a second valve 136. Gas is supplied from an array of process gas supplies 138 through an array of valves 140 which may include the first and second valves 132 and 136, for example. In one embodiment, gas species and gas flow rates into the upper and lower chambers 100a, 100b are independently controllable. The controller 126 may govern the array of valves 140. In one embodiment, an inert gas is supplied into the upper chamber 100a and a process gas is supplied into the lower chamber 100b. The inert gas flow rate may be selected to substantially prevent convection or diffusion of gases from the lower 100b into the upper chamber 100a, providing substantial chemical isolation of the upper chamber 100a.

In one embodiment, plasma may be produced in the upper chamber 100a by various bulk and surface processes, including energetic ion bombardment of the interior surface of the top electron-emitting electrode 108. The ion bombardment energy of the electrode 108 and the plasma density are functions of both RF power generators 120 and 122. The ion bombardment energy of the electrode 108 may be substantially controlled by the lower frequency power from the RF power generator 122 and the plasma density in the upper chamber 100a may be substantially controlled (enhanced) by the VHF power from the RF power generator 120. Energetic secondary electrons may be emitted from the interior surface of the electrode 108. The flux of energetic electrons from the emitting surface may comprise an electron beam, and may have a direction substantially perpendicular to the interior surface of the electrode 108, and a beam energy of approximately the ion bombardment energy of the electrode 108, which typically can range from about 10 eV to 5000 eV, such as at least greater than 100 eV. The collision cross sections for different processes depend upon the electron energy. At low energies, cross-sections for excitation (and dissociation in molecular gases) are larger than for ionization, while at high energies the reverse is true. The RF power level(s) may be advantageously selected to target various inelastic electron collision processes.

In one embodiment, a side window 170 in the side wall 102 faces the upper chamber 100a and is formed of a material (e.g., quartz or aluminum oxide) through which RF power may be inductively coupled. An inductive coil antenna 172 surrounds the side window 170 and is driven by an optional RF power generator 174 through an impedance match 176. A remote plasma source 197 may introduce plasma species into the lower chamber 100b. In the embodiment having optional RF source power generator 174 and coil antenna 172, the plasma density in the upper chamber 100a may be substantially controlled (enhanced) by the RF power from the RF power generator 174. In one example, the optional RF source power generator 174 and the coil antenna 172 may assist providing a bombardment power to sputter off materials from the electrode 108, thus assisting lodging materials onto a surface of the substrate 111 disposed on the workpiece support pedestal 110.

In one embodiment, the grid filter 104 is of a flat disk shape and may be coaxial with the side wall 102. The grid filter 104 is formed with an array of plural openings 104-1. In one embodiment, the axial thickness T of the grid filter 104 and the diameter, d, of the plural openings 104-1 are selected to promote flow through the grid filter 104 of energetic directed beam electrons while impeding flow of nonbeam (low energy) electrons and plasma ions through the grid filter 104, and the ratio of grid filter hole area to total grid filter area may be maximized. The energetic electron flux (electron beam) may pass through the grid filter 104 to the lower chamber 100b and may produce a plasma by various electron impact processes in the lower chamber 100b.

The plasma produced by the electron beam in the lower chamber 100b may have different characteristics from the plasma in the upper chamber 100a. The grid filter 104 may function as a filter to substantially electrically isolate the upper and lower chambers 100a, 100b from one another. In one embodiment, the grid filter 104 is formed of a conductive or semiconductive material, and may be connected to ground or may be electrically floating. In another embodiment, the grid filter 104 is formed of a non-conductive material. In one embodiment, the grid filter 104 may be coated with a process compatible material such as silicon, carbon, silicon carbon compound or a silicon-oxide compound. In an alternative embodiment, the grid filter 104 may be coated with a material such as aluminum oxide, yttrium oxide, or zirconium oxide. In one embodiment, the plasma produced in the upper chamber 100a may have high electron density and/or high electron temperature, and have high energy ions impinging on the electrode 108.

At least a portion of the electron beam, comprised of the secondary electron flux emitted from electrode 108 due to energetic ion bombardment of the electrode surface, propagates through the grid filter 104 and into the lower chamber 100b, producing a low electron temperature plasma in the lower chamber 100b, with a plasma density that depends upon beam energy and flux, as well as other factors such as pressure and gas composition. The energetic beam electrons may impinge upon the substrate 111 or workpiece support pedestal 110 upon leaving the plasma region of the lower chamber 100b. The plasma left behind may readily discharge any resultant surface charge caused by the electron beam flux.

Figure 2:
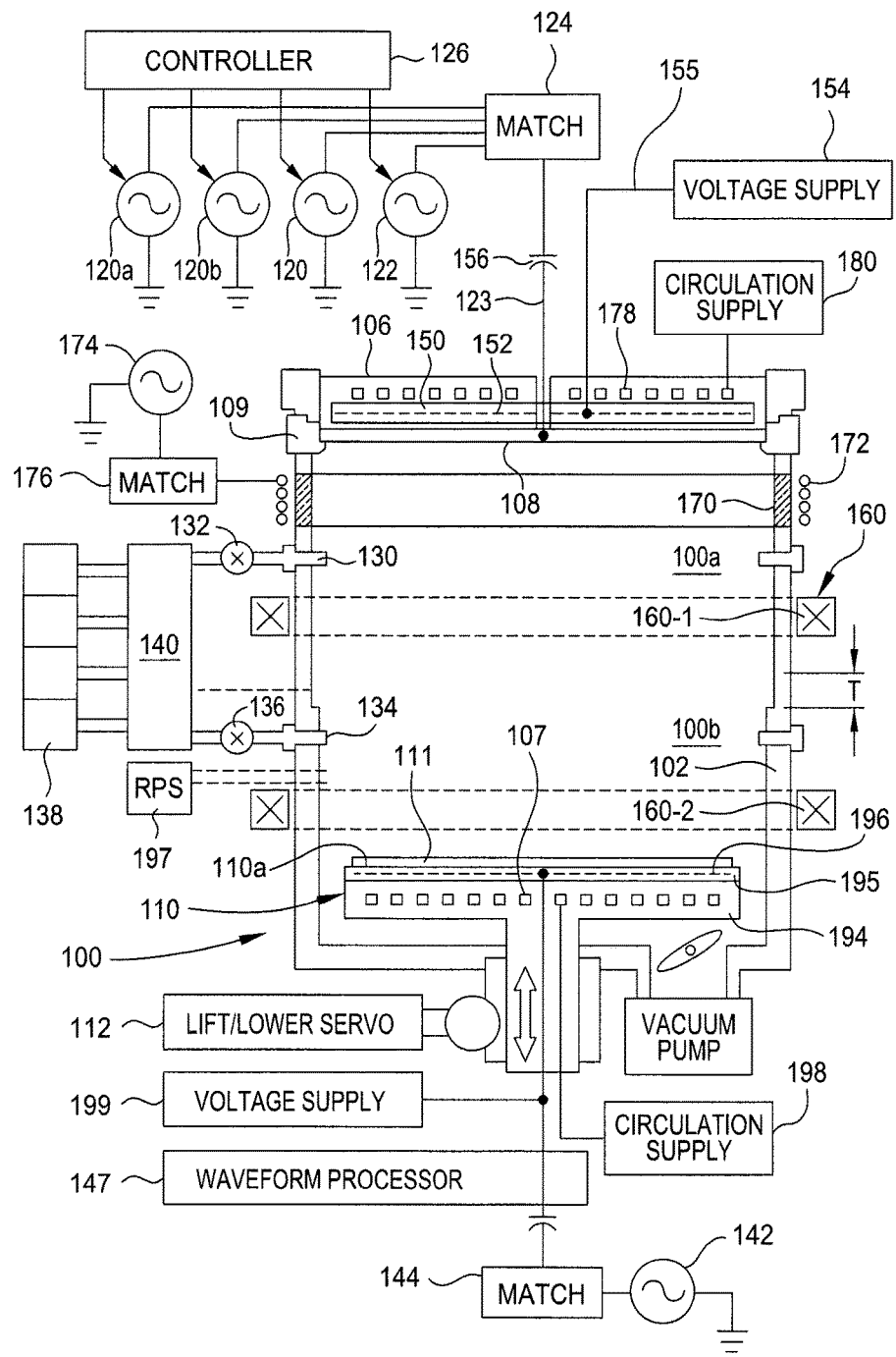
FIG. 2 depicts a schematic illustration of another example of a deposition apparatus in which electron beam plasma technique can be used to practice embodiments of the disclosure.

In some embodiments where a higher electron beam flux or higher electron beam density is required, the grid filter 104 may be removed or eliminated, as shown in FIG. 2, to assist the secondary electron beam flux emitted from electrode 108 to reach upon the substrate 111 or workpiece support pedestal 110 at a faster rate. Alternatively, the grid filter 104 may be removed or eliminated, as shown in FIG. 2, in the processing chamber 100 for any process concerns and requirements.

In one embodiment, an electronegative or electron attaching gas such as chlorine is furnished into the chamber, RF and/or VHF power is applied to the electrode 108, RF power is optionally applied to coil antenna 172, remote plasma source (RPS) power is optionally applied to a remote plasma source (RPS) 197, a plasma is generated in the upper chamber 100a and an accelerating voltage is developed on the electrode 108 with respect to ground and with respect to the plasma. The resulting energetic ion bombardment of the electrode 108 produces secondary electron emission from electrode surface, which constitutes an electron beam flux from the electrode surface. The grid filter 104 allows at least a portion of the electron beam to propagate through the grid filter 104 and into the lower chamber 100b, while preventing at least a portion of non-beam electrons and plasma ions from passing through the grid filter 104, producing a low electron temperature plasma in the lower chamber 100b. The resultant low electron temperature plasma in the lower chamber 100b in an electronegative gas such as chlorine may produce a highly electronegative plasma, with negative ion densities much higher than electron densities and approaching densities of positive ions. Such a plasma is commonly called an ion-ion plasma.

A substantially axially-directed magnetic field, substantially parallel to the electron beam, may be optionally used to help guide the electron beam, improving beam transport through the upper chamber 100a, the grid filter 104 and/or the lower chamber 100b. A low frequency bias voltage or arbitrary waveform of low repetition frequency may be applied to the workpiece support pedestal 110 (e.g., to the workpiece electrode 196) to selectively or alternately extract positive and/or negative ions from said plasma and accelerate those ions at desired energy levels to impact the surface of the substrate 111 for etching, cleaning, deposition, or other materials modification. Radicals produced (a) in the upper chamber 100a, (b) by the electron beam in the lower chamber 100b, (c) by the application of bias voltage to the workpiece support pedestal 110, or (d) by the remote plasma source (RPS) 197, may convect or diffuse to the substrate 111 and participate in reaction on the workpiece surface.

In another embodiment, a relatively inert gas such as helium or argon is furnished into the upper chamber 100a, and electronegative or electron-attaching gas, such as sulfur hexafluoride or carbon fluoride or the like, is flowed into the lower chamber 100b, RF and/or VHF power is applied to the electrode 108, RF power is optionally applied to coil antenna 172, RPS power is optionally applied to the RPS 197, a plasma is generated in the upper chamber 100a and an accelerating voltage is developed on the electrode 108 with respect to ground and with respect to the plasma. The resulting energetic ion bombardment of the electrode 108 produces secondary electron emission from electrode surface, which constitutes an electron beam flux from the electrode surface. The grid filter 104 allows at least a portion of the electron beam to propagate through the grid filter 104 and into the lower chamber 100b, while preventing at least a portion of non-beam electrons and plasma ions from passing through the grid filter 104, producing a low electron temperature plasma in the lower chamber 100b.

The resultant low electron temperature plasma in the lower plasma chamber in an electronegative gas may produce a highly electronegative plasma, with negative ion densities much higher than electron densities and approaching densities of positive ions, commonly called an ion-ion plasma.

In one embodiment, the grid filter 104 is a gas distribution plate, having internal gas passages 105a and gas injection outlets 105b. The internal gas passages 105a may be coupled to the array of valves 140.

In one embodiment, an RF bias power generator 142 is coupled through an impedance match 144 to the workpiece electrode 196 of the workpiece support pedestal 110. In a further embodiment, a waveform tailoring processor 147 may be connected between the output of the impedance match 144 and the workpiece electrode 196. The waveform tailoring processor 147 changes the waveform produced by the RF bias power generator 142 to a desired waveform. The ion energy of plasma near the substrate 111 is controlled by the waveform tailoring processor 147. In one embodiment, the waveform tailoring processor 147 produces a waveform in which the amplitude is held during a certain portion of each RF cycle at a level corresponding to a desired ion energy level. The controller 126 may control the waveform tailoring processor 147.

In one embodiment, a magnet 160 surrounds the chamber 100. In one embodiment, the magnet comprises a pair of magnets 160-1, 160-2 adjacent the upper and lower chambers 100a, 100b, respectively. In one embodiment, the pair of magnets 160-1, 160-2 provides an axial magnetic field suitable for confining an electron beam that is propagating from the upper chamber 100a to the lower chamber 100b.

In one embodiment, flow of energetic electrons to the substrate 111 is blocked by a magnetic field having a predominantly radial component (i.e., transverse to the electron beam flow direction) in the region between the grid filter 104 and the substrate 111. This magnetic field may be produced by one of the magnets 160-1 or 160-2, or by another magnet or set of magnets.

In one embodiment, the internal passages 178 for conducting a thermally conductive liquid or media inside the ceiling 106 are connected to a thermal media circulation supply 180. The thermal media circulation supply 180 acts as a heat sink or a heat source. The mechanical contact between the electrode 108 and the ceiling 106 is sufficient to maintain high thermal conductance between the electrode 108 and the ceiling 106. In the embodiment of FIG. 1, the force of the mechanical contact is regulated by the electrostatic clamping force provided by the DC chucking voltage supply 154.

Figure 3:
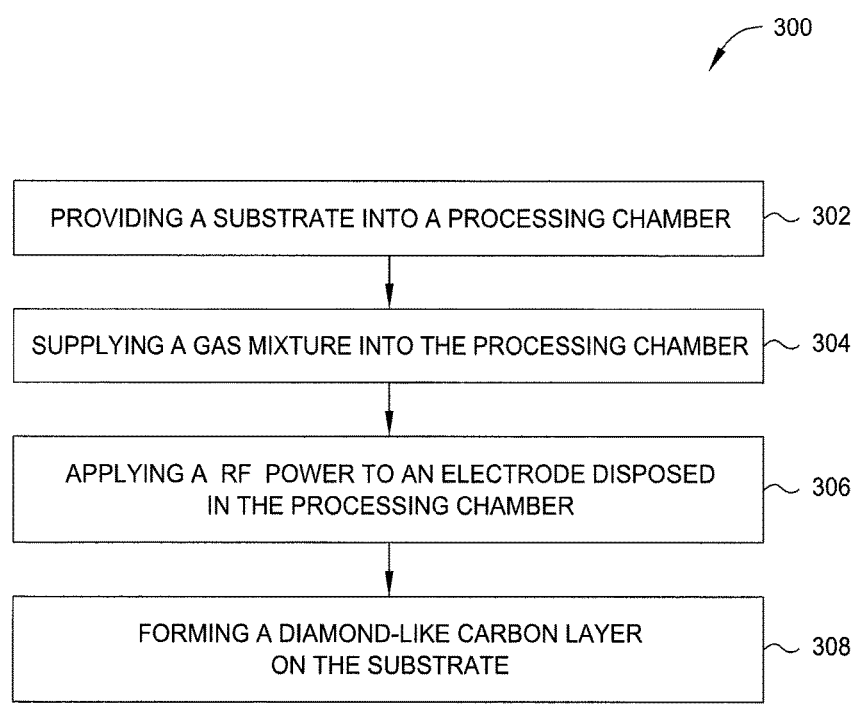
FIG. 3 depicts a flow process diagram of one embodiment of a film formation process.
Figure 4A:
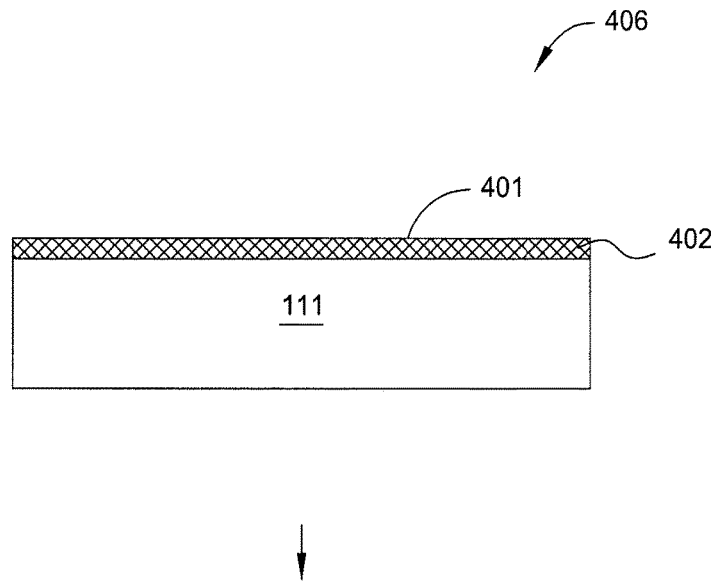
FIGS. 4A-4B depict a sequence of schematic cross-sectional views of a substrate structure incorporating a diamond like carbon layer formed on a substrate according to the method of FIG. 3.
Figure 4B:
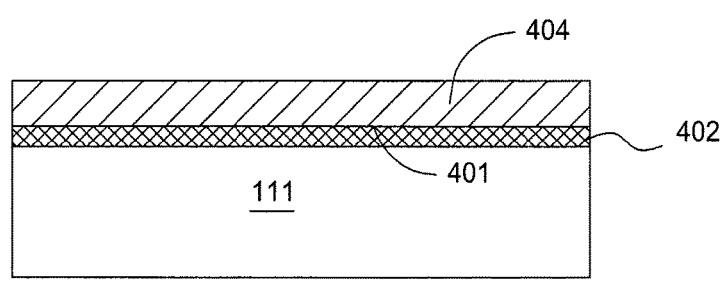

FIG. 3 illustrates a process flow diagram of a method 300 for forming a diamond like carbon layer according to one embodiment of the present disclosure. FIGS. 4A-4B are schematic cross-sectional view illustrating a sequence for forming a diamond like carbon layer for use as a hardmask layer according to the method 300.

The method 300 begins at operation 302 by providing a substrate 111 having a material layer 402 disposed thereon, as shown in FIG. 4A, into a processing chamber, such as the electron beam plasma processing chamber 100 depicted in FIG. 1 or 2. The substrate 111 may have a substantially planar surface, an uneven surface, or a structure formed thereon. In one embodiment, the material layer 402 may be a part of a film stack utilized to form a gate structure, a contact structure, an interconnection structure or shallow trench isolation (STI) structure in the front end or back end processes for logic or memory devices, such as NAND structures. In embodiments wherein the material layer 402 is not present, the method 300 be directly formed in the substrate 111.

In one embodiment, the material layer 402 may be a film stack including repeating layers of silicon oxide and/or silicon nitride layers utilized to form a gate structure for NAND structures. Alternatively, the material layer 402 may be a silicon material utilized to form a gate electrode. In yet another embodiment, the material layer 402 may include a silicon oxide layer, a silicon oxide layer deposited over a silicon layer. In yet another embodiment, the material layer 402 may include one or more layers of other dielectric materials utilized to fabricate semiconductor devices. Suitable examples of the dielectric layers include silicon oxide, silicon nitride, silicon oxynitride, silicon carbide, or any suitable low-k or porous dielectric material as needed. In still another embodiment, the material layer 402 does not include any metal layers.

At operation 304, a gas mixture is supplied into the electron beam plasma processing chamber 100 in preparation for forming a diamond like carbon layer 404 on the substrate 111, as shown in FIG. 4B. The gas mixture may be supplied from the process gas supplies 138 through the array of valves 140 to the gas injectors 130, 134 respectively flowing into the electron beam plasma processing chamber 100.

The gas mixture includes at least a hydrocarbon compound and an inert gas. In one embodiment, hydrocarbon compound has a formula $C_xH_y$, where x has a range between 1 and 12 and y has a range of between 4 and 26. More specifically, aliphatic hydrocarbons include, for example, alkanes such as methane, ethane, propane, butane, pentane, hexane, heptane, octane, nonane, decane and the like; alkenes such as propene, ethylene, propylene, butylene, pentene, and the like; dienes such as hexadiene butadiene, isoprene, pentadiene and the like; alkynes such as acetylene, vinylacetylene and the like. Alicyclic hydrocarbons include, for example, cyclopropane, cyclobutane, cyclopentane, cyclopentadiene, toluene and the like. Aromatic hydrocarbons include, for example, benzene, styrene, toluene, xylene, pyridine, ethylbenzene, acetophenone, methyl benzoate, phenyl acetate, phenol, cresol, furan, and the like. Additionally, alpha-terpinene, cymene, 1,1,3,3,-tetramethyl-butylbenzene, t-butylether, t-butylethylene, methyl-methacrylate, and t-butylfurfurylether may be utilized. Additionally, alpha-terpinene, cymene, 1,1,3,3,-tetramethylbutylbenzene, t-butylether, t-butylethylene, methyl-methacrylate, and t-butylfurfurylether may be selected. In an exemplary embodiment, the hydrocarbon compounds are propene, acetylene, ethylene, propylene, butylenes, toluene, alpha-terpinene.

Alternatively, one or more additional hydrocarbon compounds may be mixed with the hydrocarbon compound present in the gas mixture supplied to the process chamber. A mixture of two or more hydrocarbon compounds may be used to deposit the amorphous carbon material.

In a particular embodiment, the hydrocarbon compound includes methane (CH4). In another embodiment, the hydrocarbon compound includes methane (CH4) and at least one of propene ($C_3H_6$), acetylene ($C_2H_2$) or ethylene ($C_2H_4$).

The inert gas, such as argon (Ar) or helium (He), is supplied with the gas mixture into the processing chamber 100. Other carrier gases, such as nitrogen ($N_2$), oxygen gas ($O_2$), carbon oxide (CO), nitric oxide (NO), hydrogen ($H_2$), ammonia ($NH_3$), a mixture of hydrogen ($H_2$) and nitrogen ($N_2$), or combinations thereof may also be used to control the density and deposition rate of the diamond like carbon layer, as necessary. The addition of hydrogen or nitrogen may be used to control the hydrogen ratio (e.g., carbon to hydrogen ratio) of the deposited diamond like carbon layer. The hydrogen ratio present in the diamond like carbon layer provides control over layer properties, such as reflectivity, transparency and density.

In one embodiment, an inert gas, such as argon (Ar) or helium (He) gas, is supplied with the hydrocarbon compound, such as methane ($CH_4$), into the process chamber to deposit the diamond like carbon layer. The inert gas provided in the gas mixture may assist control of the optical and mechanical properties of the as-deposited layer, such as the index of refraction (n) and the absorption coefficient (k), hardness, density and elastic modulus of the diamond like carbon layer 404.

In one embodiment, the hydrocarbon compound, such as methane ($CH_4$), may be supplied in the gas mixture at a rate between about 50 sccm and about 1000 sccm. The inert gas, such as Ar or He gas, may be supplied in the gas mixture at a rate between about 10 sccm and about 1000 sccm. A hydrogen gas ($H_2$) may be supplied in the gas mixture at a rate between about 100 sccm and about 500 sccm. A oxygen gas ($O_2$) may be supplied in the gas mixture at a rate between about 0 sccm and about 200 sccm. A nitrogen gas ($N_2$) may be supplied in the gas mixture at a rate between about 0 sccm and about 400 sccm. Also, the at least one of the propene ($C_3H_6$), acetylene ($C_2H_2$) or ethylene ($C_2H_4$) may be supplied into the gas mixture at a flow rate at between about 100 sccm and about 2000 sccm.

In one example, adjustable flow ratio and species may be controlled and supplied from different locations, such as upper or lower injectors 130, 134, to the processing chamber 100 so as to maximize radical dissociation and plasma density below or above the grid filter 104. For example, if a higher plasma density is desired in the upper chamber 100a so as to increase beam electron flux, an inert gas, such as Ar or He, may be supplied through the upper injector 130, which may promote electrode bombardment and reduce molecule gas density near the electrode 108 so as to increase local plasma density and beam electron flux. In contrast, when dissociation of hydrogen molecules is desired (e.g., increasing resultant film purity), a hydrogen containing gas may be supplied through the injector 130 so as to lower local plasma density but promote hydrogen radical formation to drive out impurities in the processing chamber as well as in the resultant diamond like carbon layer 404.

At operation 306, after the gas mixture is supplied into the processing chamber, a first RF source power may be generated from the RF source power generators 120, 122, and applied to the electrode 108, to generate plasma and secondary electron beams. Secondary electron beams from the electrode 108 may generate cold plasma, such as a temperature less than 100 degrees Celsius as described above, that irradiates a surface 401 of the material layer 402 to form the diamond like 404 thereon. Additionally, a second optional RF power may also be applied to the coil antenna 172 through the RF source power generator 174 to add inductively coupled power. The inductively coupled power as generated may increase the radical flux to the substrate and increases the ion flux incident (or beam flux) on the electrons in the upper chamber 100a so as to produce high density of beam electrons. Furthermore, the inductively coupled power also lowers the sheath voltage on the electrode 108, thus reducing beam energy.

In one example, a first RF source power generated from the RF source power generators 120, 122 to be applied to the electrode 108 is controlled at a range of between 1 KWatts and about 10 KWatts. It is noted that the frequency of the RF source power generators 120, 122 may be between 2 MHz and about 60 MHz. A second source power (e.g., an inductively coupled power) generated from the RF source power generator 174 to be applied to the coil antenna 172 is controlled at between about 1 KWatts and about 10 KWatts. The frequency of the inductively coupled power applied to the coil antenna 172 may be between 2 MHz and about 13 MHz. In some embodiment, the inductively coupled power may be eliminated and optionally applied as needed. A process pressure, for example between 20 mTorr and about 20 Tor, may also be utilized to form the diamond like carbon layer 404. It is believed that the electron beam plasma along with the secondary electron beams utilized during the deposition process may provide higher ion bombardment that may enhance dissociation of the ions and energy of the electron beams from the gas mixture, so as to form the diamond like carbon layer 404 with a robust film structure.

During deposition, the substrate temperature may be controlled between from room temperature (e.g., 20 degrees Celsius) and about 1000 degrees Celsius. The spacing between the substrate and showerhead may be controlled at about 200 mils to about 1000 mils.

As discussed above, the electron beam plasma and the secondary electron beam provided from the electrode 108 are accelerated by electrode sheath, thus acquiring further energy when entering the bulk plasma. These accelerated electrons provide sufficient high energy to efficiently dissociate hydrogen from the molecules, producing enough hydrogen radicals to extract hydrogen impurities from the carbon films, such as the carbon layer 404 formed on the substrate 111, thus forming the diamond like carbon layer 404 with high purity. The accelerated secondary beam electrons create low temperature plasma, so called cold plasma, above the substrate 111 (at the lower chamber region 100*b* under the grid filter 104). Thus, low energy electron from the cold plasma is generated sufficiently to efficiently dissociate hydrogen molecules in vibrational states and produce hydrogen radicals, so as to increase the hydrogen radical flux onto the substrate surface.

Furthermore, as the accelerated secondary electron beam emitted from the electrode 108 reaches to the substrate surface, the high energy carried from the accelerated secondary electron beam, e.g., in the order of hundreds of electron volts (eV) to thousands of electron volts (eV), may induce surface reaction, such as exciting carbon sp3 surface state to form diamond like carbon layer 404 on the substrate 111 as well and breaking weak (or undesired) carbon sp or sp2 bonds or even C—H bonds, thus increasing sp3 bonding which may promote formation of the diamond like carbon layer, rather than amorphous state or other structures of the carbon structures. The carbon elements bonded in the diamond like carbon layer 404 may mostly form in sp3 carbons with four single bonds pointing towards the corner of a tetrahedron bonding with other carbon elements. Undesired sp2 hybridized carbons with two single and one double bond, e.g., the three bonds pointing towards the corners of a triangle, often results in the film structure becoming in amorphous state, rather than desired diamond like structures. The amount of hydrogen termination bonds and the extents of any missing or dangling carbon bonds included in the sp3 hybridized carbons or sp2 hybridized carbons affect how tightly these carbon atoms are networked and packed, thus determining film density and stress. The diamond like carbon layer 404 is configured to form with complete sp3 hybridization and zero hydrogen content when all carbon atoms are fully interconnected. In one example, the accelerated secondary electron beam may have a beam energy greater than 100 eV.

Thus, the diamond like carbon layer 404 as formed herein is configured to have a density greater than 2.5 g/cc. Other film properties, such as film transparency, remain at a desired level under the diamond like carbon structures. In one embodiment, the absorption coefficient (k) of the diamond like carbon layer 404 may be controlled between about 0.2 and about 1.8 at a wavelength about 633 nm, and between about 0.4 and about 1.3 at a wavelength about 243 nm, and between about 0.3 and about 0.6 at a wavelength about 193 nm. The diamond like carbon layer 404 may have a thickness 408 between about 10 nm and about 300 nm.

Furthermore, the accelerated, e.g., fast, electron bombardment from the electrode 108 to the substrate surface may also assist releasing stress of the resultant diamond like carbon layer 404, thus forming the carbon like carbon layer 404 with desired low stress level, such as between less than 800 mega-pascal (MPa) compressive, such as between about 800 mega-pascal (MPa) compressive and about 100 mega-pascal (MPa) compressive.

As discussed above, the accelerated secondary electrons assist extracting hydrogens from $CH_4$ to form hydrogen radicals, which may assist driving out impurities from the resultant film structure. Furthermore, a portion of the secondary electrons passing through the grid filter 104 to the lower chamber may become low electron temperature plasma, e.g., so called cold plasma. Low electron temperature often has low electron energy less than 1 eV, such as less than 0.5 eV. Such low electron temperature plasma with low energy electrons may dissociate hydrogen molecules to increase hydrogen radical flux onto the substrate surface. The cold plasma utilized during the deposition process may keep the substrate support pedestal in a low temperature range, such as, less than 100 degrees Celsius, without the need of using expensive and complex temperature control as conventionally needed. In conventional practices, a high substrate temperature resulting from a heated substrate support pedestal is often required to provide sufficient thermal energy to the electrons to break hydrogen molecules to extract and provide hydrogen radicals. However, such high temperature process often results in high film stress, which may induce substrate warpage, substrate bow or depth of focus issue during the subsequent lithography process. Thus, by utilizing the low substrate temperature process, the resultant diamond like carbon layer 404 is formed with low stress level as well as high film density that may facilitate good etching and lithographic process control during subsequent processes.

At operation 308, after the deposition process is performed by the process parameters regulated at operation 304 and 306, the diamond like carbon layer 404 is then formed on the substrate 111. In the situation that a high purity diamond like carbon layer 404 is desired (with low sp2, or sp bonding structures), an optional post treatment process may be performed to assist driving out undesired impurities from the resultant diamond like carbon layer 404. During deposition, undesired hydrogen bonding, carbon sp, carbon sp2 impurities may be inevitably formed. Thus, the post treatment process may be optionally performed to assist driving out the impurities. In one embodiment, the post treatment process may be an electron beam plasma treatment process using Ar plasma. The plasma treatment may be an electron beam (e.g., e-beam) plasma treatment performed in an electron beam treatment chamber. The deposition process at operation 304, 306 and 308 and the post treatment of electron beam treatment process are performed in-situ in the processing chamber 100 depicted in FIG. 1 without breaking vacuum.

During the post treatment process, the treatment gas that may be used includes inert gas treatment, such as Ar or He. In an exemplary embodiment, the treatment gas as used is Ar gas.

The method 300 is useful for the process used in the front end process (FEOL) prior to metallization process in a semiconductor device manufacturing process. The diamond like carbon layer is desirable to serve as a hardmask layer during an etching process due to its high etching selectivity. Suitable front end process (FEOL) includes gate manufacturing applications, contact structure applications, shallow trench isolation (STI) process, and the like. In the embodiments wherein the diamond like carbon layer may also be used as an etch stop layer or used as different films for different process purposes, the mechanical or optical properties of the film may be adjusted as well to meet the particular process need.

Thus, a method for forming a diamond like carbon layer having both desired density and optical film properties with low stress are provided by an electron beam plasma deposition process. The method advantageously provides a diamond like carbon layer with desired mechanical properties, such as low stress and high density as well as high etching selectivity and film transparency. Also, the diamond like carbon layer may also be easily removed from the substrate by an oxygen strip or ashing process. The improved mechanical properties of the diamond like carbon layer provides high film selectivity and quality for the subsequent etching process while maintaining desired range of the film flatness, stress level and film optical properties, such as index of refraction (n) and the absorption coefficient (k), for the subsequent lithography process.

While the foregoing is directed to embodiments of the present disclosure, other and further embodiments of the disclosure may be devised without departing from the basic scope thereof, and the scope thereof is determined by the claims that follow.

What is claimed is:

1. A method of forming a diamond like carbon layer, comprising:
    generating an electron beam plasma above a surface of a substrate disposed in a processing chamber, generating the electron beam plasma comprising:
        applying a first RF source power to an electrode disposed in the processing chamber; and
        bombarding the electrode to provide secondary electrons and a secondary electron beam flux to the surface of the substrate; and
    forming a diamond like carbon layer on the surface of the substrate disposed in the processing chamber.

2. The method of claim 1, wherein providing the electron beam plasma further comprises:
    supplying a gas mixture to the processing chamber while generating the electron beam plasma, wherein the gas mixture includes a hydrocarbon compound.

3. The method of claim 2, wherein the hydrocarbon compound is selected from a group consisting of $CH_4$, $C_3H_6$, $C_2H_2$ and $C_2H_4$.

4. The method of claim 1, wherein bombarding the electrode to provide secondary electrons and secondary electron beam flux further comprises:
    providing secondary electron with low electron energy less than 1 eV to the surface of the substrate.

5. The method of claim 4, wherein providing low electron energy further comprises:
    maintaining a substrate temperature less than 100 degrees Celsius.

6. The method of claim 1, wherein the secondary electron beam flux carries an electron beam energy greater than 100 eV.

7. The method of claim 1, wherein the diamond like carbon layer has a film density greater than 2.5 g/cc.

8. The method of claim 1, wherein the diamond like carbon layer has a film stress less than 800 mega-pascal (MPa) compressive.

9. The method of claim 1, wherein applying the first RF source power further comprises:
    applying a second RF power to an antenna coil disposed adjacent to the processing chamber.

10. The method of claim 1, wherein applying the first RF source power further comprises:
    applying a remote plasma source to the processing chamber.

11. The method of claim 1, wherein the electrode is fabricated from a carbon material.

12. The method of claim 1, further comprising:
    performing a post electron beam treatment process on the diamond like carbon layer.

13. The method of claim 12, wherein the post electron beam treatment process includes an inert gas treatment process.

14. The method of claim 1, wherein the diamond like carbon layer serves as a hardmask layer in an etching process.

15. The method of claim 1, wherein the substrate comprises a material layer disposed thereon prior to forming the diamond like carbon layer on the substrate, wherein the material layer is selected from a group consisting of silicon oxide, silicon nitride, silicon oxynitride, silicon carbide, low-k and porous dielectric material.

16. A method of forming a diamond like carbon layer, the method comprising:
    bombarding a carbon containing electrode disposed in a processing chamber to generate a secondary electron beam plasma and a secondary electron beam flux in a gas mixture containing carbon above a surface of a substrate disposed in the processing chamber; and
    forming a diamond like carbon layer on the surface of the substrate from elements of the gas mixture.

* * * * *